United States Patent [19]
Arnold

[11] Patent Number: 5,467,026
[45] Date of Patent: Nov. 14, 1995

[54] PSEUDO-NMOS LOGIC CIRCUITS WITH NEGLIGIBLE STATIC CURRENT DURING QUIESCENT CURRENT TESTING

[75] Inventor: Barry J. Arnold, Fort Collins, Colo.

[73] Assignee: Hewlett-Packard Company, Palo Alto, Calif.

[21] Appl. No.: 183,539

[22] Filed: Jan. 18, 1994

[51] Int. Cl.⁶ .......................... H03K 19/00; H03K 17/16
[52] U.S. Cl. .............................. 326/16; 326/33; 327/530; 324/522
[58] Field of Search .................................. 326/16, 33, 34; 327/530, 545; 324/522

[56] References Cited

U.S. PATENT DOCUMENTS

| | | | |
|---|---|---|---|
| 4,549,101 | 10/1985 | Sood | 307/443 |
| 5,192,881 | 3/1993 | Martin | 307/468 |

Primary Examiner—Edward P. Westin
Assistant Examiner—Richard Roseen
Attorney, Agent, or Firm—Augustus W. Winfield

[57] ABSTRACT

A modified pseudo-nMOS logic gate for use in systems in which quiescent current testing is desired. The load transistor of each pseudo-nMOS gate is controlled by a two-input load control gate. One input of the load control gate is connected to a global test signal and the second input of the load control gate is connected to the output of the pseudo-nMOS gate. In normal operation, the global test signal is logically true, and the load control gate has no effect on the pseudo-nMOS gate. During quiescent current testing, the global test signal is logically false and the output of the load control gate is determined by the logical output of the pseudo-nMOS gate. If the output of the pseudo-nMOS gate is logically true, the load control gate has no effect on the pseudo-nMOS gate. If the output of the pseudo-nMOS gate is logically false, the load control gate turns off the load transistor so that no static current flows through the load transistor. As a result, the logical state of the pseudo-nMOS gate is preserved, but the modified gate draws negligible static current during quiescent current testing.

2 Claims, 5 Drawing Sheets

PSEUDO-NMOS LOGIC CIRCUITS WITH NEGLIGIBLE STATIC CURRENT DURING QUIESCENT CURRENT TESTING

FIELD OF INVENTION

This invention relates generally to integrated circuit testing and design for testability and more specifically to a modified logic gate suitable for use during detection of bridging faults using quiescent power supply measurement.

BACKGROUND OF THE INVENTION

During the manufacturing of digital integrated circuits, a manufacturing defect may result in an unintentional resistive path between different signal nodes, between a signal node and a power supply node, or between a signal node and ground. One common test approach is to apply sequences of logical input signals and monitor the resulting output signals. As complexity grows, however, it becomes increasingly difficult to find an input signal sequence that correctly exercises all internal nodes of interest and that guarantees that an internal node fault will propagate to an output for detection. In addition, a node defect may not be detectable as a logical fault. For example, as a result of a resistive or shorted node, circuitry may simultaneously pull-up and pull-down the node. The result of the conflicting conductances may be an intermediate voltage that may or may not induce logic errors. Conflicting conductances may, however, result in a detectable increase in power supply current. For example, if a node is shorted to ground and a gate attached to the shorted node attempts to drive the shorted node to a supply voltage (or conversely, if a node is shorted to a supply voltage and a gate attempts to drive the shorted node to ground), the shorted node may cause a detectable increase in the current drawn by the integrated circuit. If the current change is detectable, the node fault may be detectable without having to propagate the fault to an output node. In addition, the node fault may be detectable even if no logical error is induced. Testing based on detecting an increase in power supply current is called quiescent current testing or IDDQ testing. For a collection of articles providing general background information, see Y. K. Malaiya and R. Rajsuman, *Bridging Faults and IDDQ Testing*, IEEE Computer Society Press, 1992.

Standard CMOS logic requires each input to be connected to the gate of both an nMOS and a pMOS transistor. Implementing a gate requiting a large "fan-in" (many inputs) using standard CMOS may require multiple levels of standard gates, each gate having a limited number of inputs. There are other gate designs, for example pseudo-nMOS gates, that require only one transistor per input. Pseudo-nMOS gates permit a reduction in the gate size, a reduction in the gate delay time (by implementing a logic function in a single level), and a reduction in complexity relative to standard CMOS gates but typically at the expense of an increase in power relative to standard CMOS. In complex integrated logic circuits, it is sometimes desirable to mix the types of logic gates, using pseudo-nMOS gates where appropriate for high fan-in and using standard CMOS gates for the remainder of the logic circuitry.

Quiescent current testing is typically limited to static logic circuitry in which there is negligible static current. In particular, IDDQ testing is especially useful for standard CMOS logic, which draws negligible current under static conditions. Pseudo-nMOS gates, however, inherently draw current even under static conditions. For example, pseudo-nMOS NOR gates typically have multiple nMOS logic switches between an output and ground and a single p-channel MOSFET load transistor between a power supply and the output, with the gate of the load transistor connected to ground. If the output of the pseudo-nMOS gate is high, there is no static current. If the output of the pseudo-nMOS gate is pulled low by one or more logic switches, current flows through the load transistor. The magnitude of this current is much greater than the magnitude of quiescent current for standard CMOS logic and may be on the same order as the current due to defective shorted nodes in standard CMOS logic. Therefore, quiescent current testing is typically impractical in a design including pseudo-nMOS gates. There is a need, in a logic system containing a mix of standard CMOS gates and pseudo-nMOS gates, to be able to use quiescent current testing for the logic system.

SUMMARY OF THE INVENTION

In the present invention, the load transistor of each pseudo-nMOS gate is controlled by a two-input load control gate. One input of the load control gate is connected to a global test signal and the second input of the load control gate is connected to the output of the pseudo-nMOS gate. In normal operation, the global test signal is logically true, and the load control gate has no effect on the pseudo-nMOS gate. During quiescent current testing, the global test signal is logically false and the output of the load control gate is determined by the logical output of the pseudo-nMOS gate. If the output of the pseudo-nMOS gate is logically true, the load control gate has no effect on the pseudo-nMOS gate. If the output of the pseudo-nMOS gate is logically false, the load control gate turns off the load transistor so that no static current flows through the load transistor. As a result, during quiescent current testing, the logical function of the pseudo-nMOS gate is preserved but the modified gate draws negligible static current.

DETAILED DESCRIPTION OF THE PREFERRED EMBODIMENT OF THE INVENTION

Figure 1A:
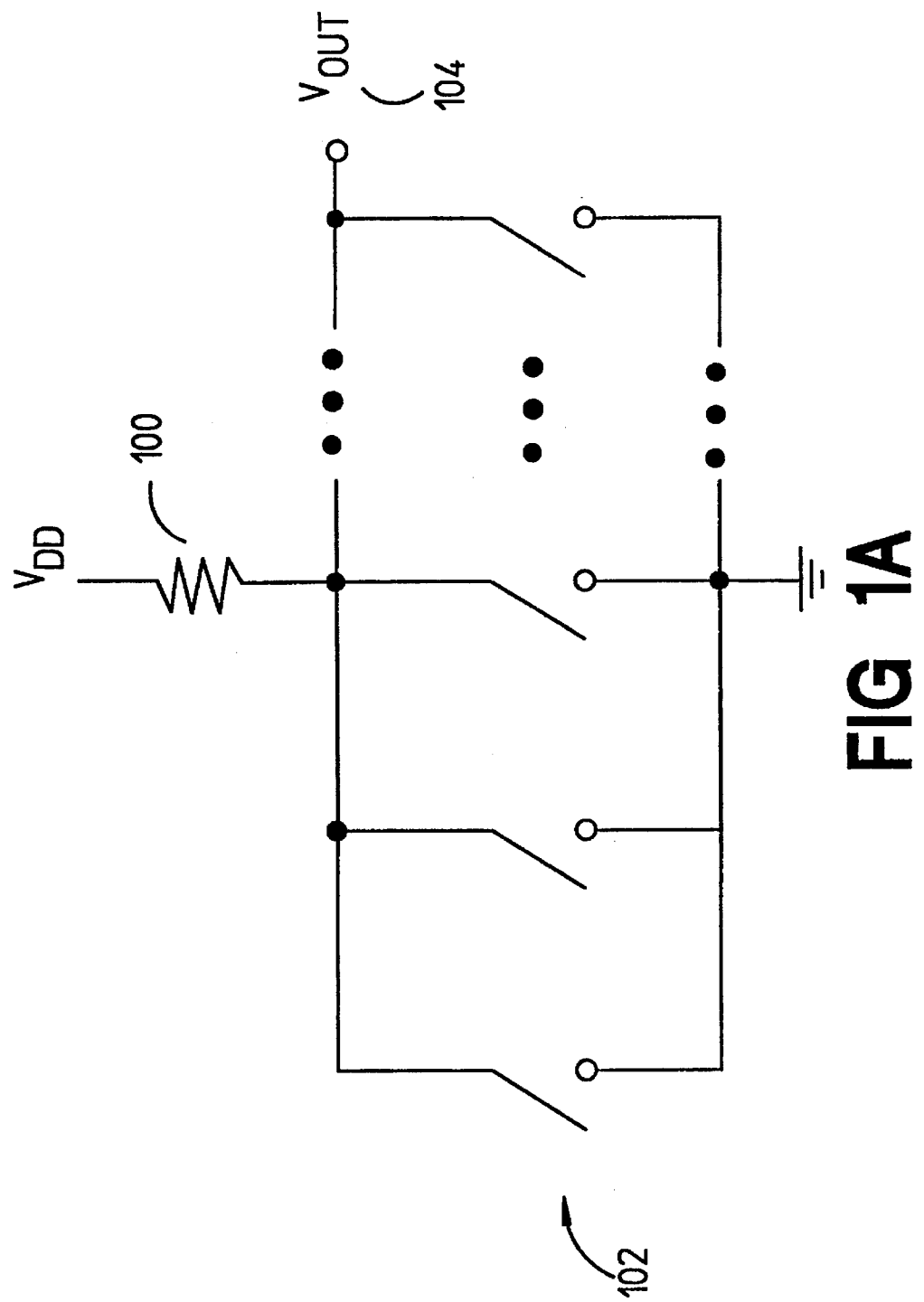
FIG. 1A is a schematic of a generalized logical NOR gate having an arbitrary number of inputs.

FIG. 1A illustrates a generalized logical NOR gate having an arbitrary number of inputs. A resistive load 100 pulls the output 104 high if none of the input switches 102 are closed. If any of the input switches 102 are closed, the output 104 is pulled low. If the output 104 is pulled low, current flows through the load 100.

Figure 1B:
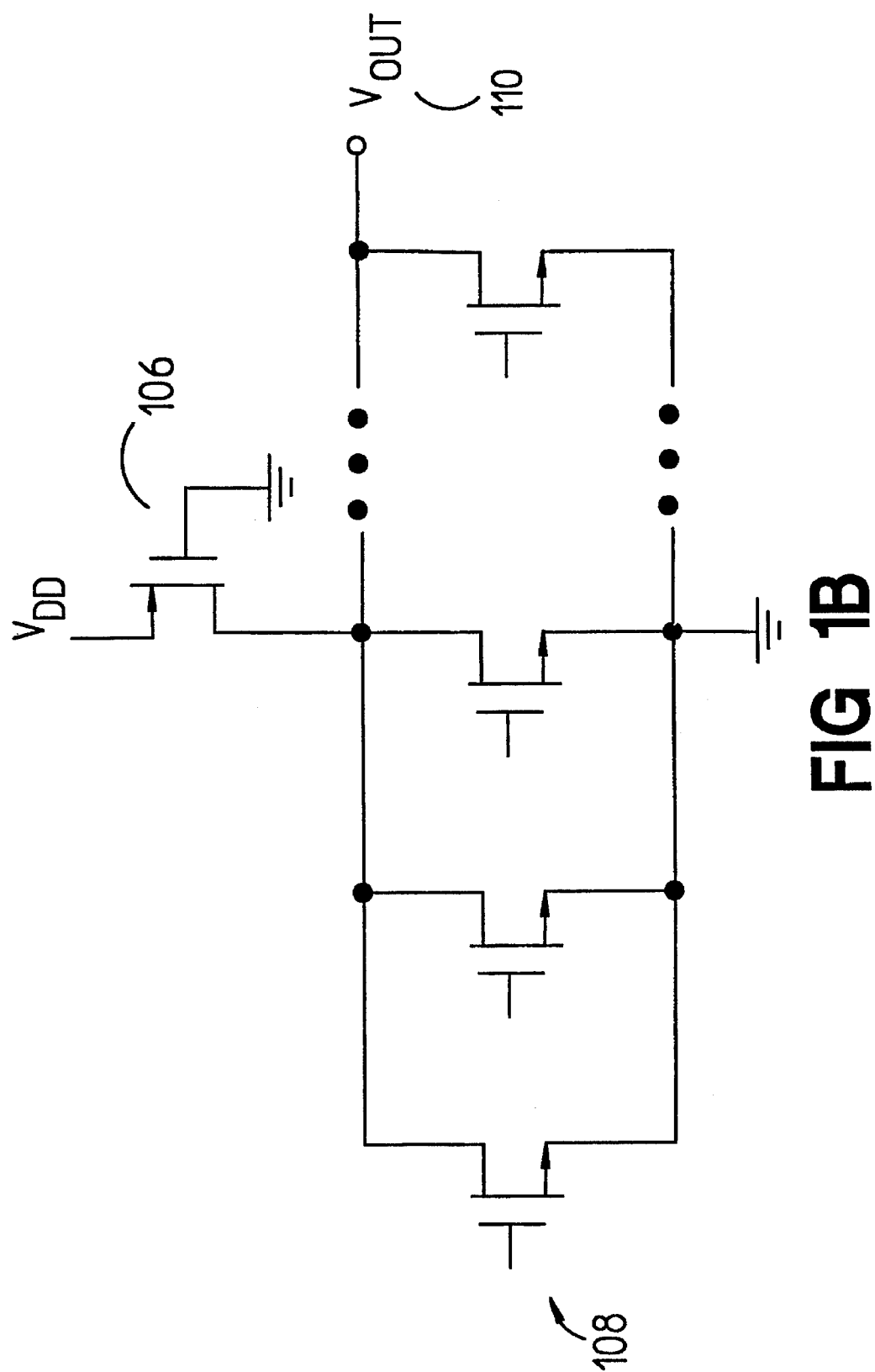
FIG. 1B is a schematic of the gate of FIG. 1A realized as a pseudo-nMOS NOR gate.

FIG. 1B illustrates the generalized gate of FIG. 1A realized as a pseudo-nMOS NOR gate. The load resistor 100 of FIG. 1A is implemented in FIG. 1B with a p-channel MOSFET 106 with its gate tied to ground. The input switches 102 of FIG. 1A are implemented in FIG. 1B as n-channel MOSFETS 108. If none of the input transistors 108 are switched on, the load transistor 106 pulls the output 110 high. If any of the input transistors 108 are switched on, the output 110 is pulled low. If the output 110 is pulled low, current flows through the load transistor 106. The impedance of the load 106 needs to be relatively low to provide a short rise time for the output 110. When the load 106 and one or more input switches 108 are conducting simultaneously, the output voltage 100 is a fraction of the power supply voltage as determined by the impedance of the load 106 relative to the impedance of one or more input switches 108. In order to provide a low output 110, the MOSFETS are sized so that the impedance of the load 106 is high relative to the impedance of the input switches 108.

The primary goal of the present invention is to prevent current flow through the modified pseudo-nMOS gate during quiescent current testing. A necessary second goal is for the modified pseudo-nMOS gate to provide valid logical outputs during quiescent current testing. Note that in a mixed system, the output 110 of the modified pseudo-nMOS gate may be connected to the input of a standard CMOS gate. During quiescent current testing, the modified pseudo-nMOS gate must provide valid output signals so that gates connected to the output remain at the proper state for testing. If the input of a standard CMOS gate is at an intermediate voltage, the CMOS gate will simultaneously pull-up and pull-down, drawing a high static current. Therefore, during quiescent current testing, when the output 110 of the modified pseudo-nMOS gate is high, the load transistor 106 must be on to provide active pull-up. Otherwise, the output 110 could drift during quiescent current testing, which in turn could cause a high static current in a mixed system as just described. Therefore, during quiescent current testing, when the output 110 of the modified pseudo-nMOS gate is high, the load transistor 106 must be on to provide active pull-up but when the output 110 of the modified pseudo-nMOS gate is low, the load transistor 106 must be off to prevent current flow.

Figure 1C:
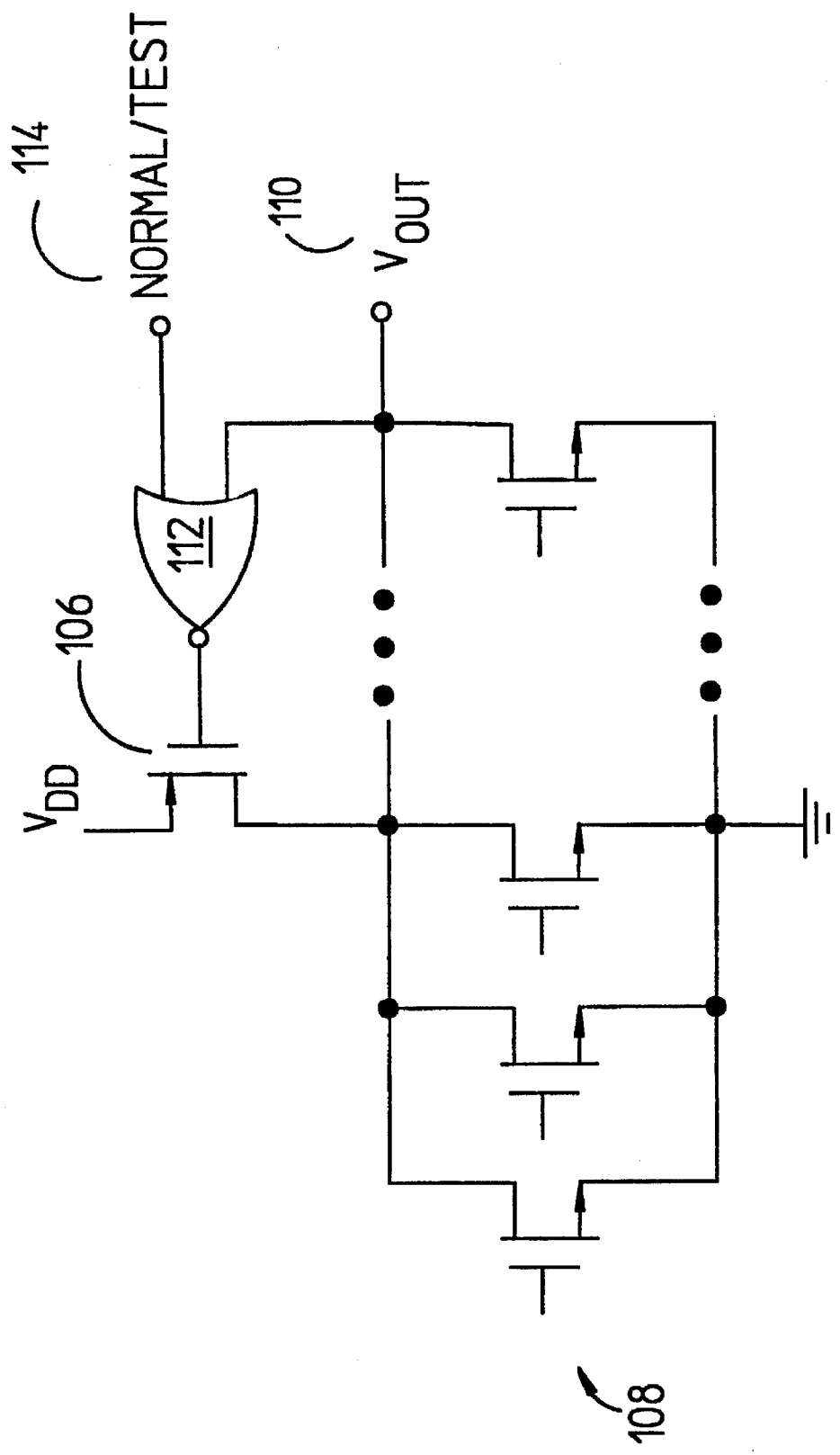
FIG. 1C is a schematic of the gate of FIG. 1B modified in accordance with the present invention.

FIG. 1C illustrates a modified pseudo-nMOS gate satisfying the above goals. In FIG. 1C, the gate of the load transistor 106 is controlled by a two-input static load control gate 112. In FIG. 1C, the load control gate 112 is depicted as a logical NOR gate. Mode input 114 (NORMAL/TEST) is a global signal that is normally logically true but is logically false during quiescent current testing. In normal operation, when the mode signal 114 is logically true, the load control gate 112 has no effect on the modified pseudo-nMOS gate. That is, during normal operation, the load control gate 112 holds the gate of the load transistor 106 low so the circuit illustrated in FIG. 1C operates in the same manner as the circuit in FIG. 1B. During quiescent current testing, the global test signal 114 is logically false and the output of the load control gate 112 is determined by the logical output 110 of the modified pseudo-nMOS gate. If the output 110 of the modified pseudo-nMOS gate is high, the load control gate 112 holds the gate of the load transistor 106 low just as in normal operation. If the output 110 of the modified pseudo-nMOS gate is low, the load control gate 112 turns off the load transistor 106 so that no static current flows through the load transistor 106. As a result, during quiescent current testing, the logical function of the modified pseudo-nMOS gate is preserved but the modified gate draws negligible static current.

Figure 2:
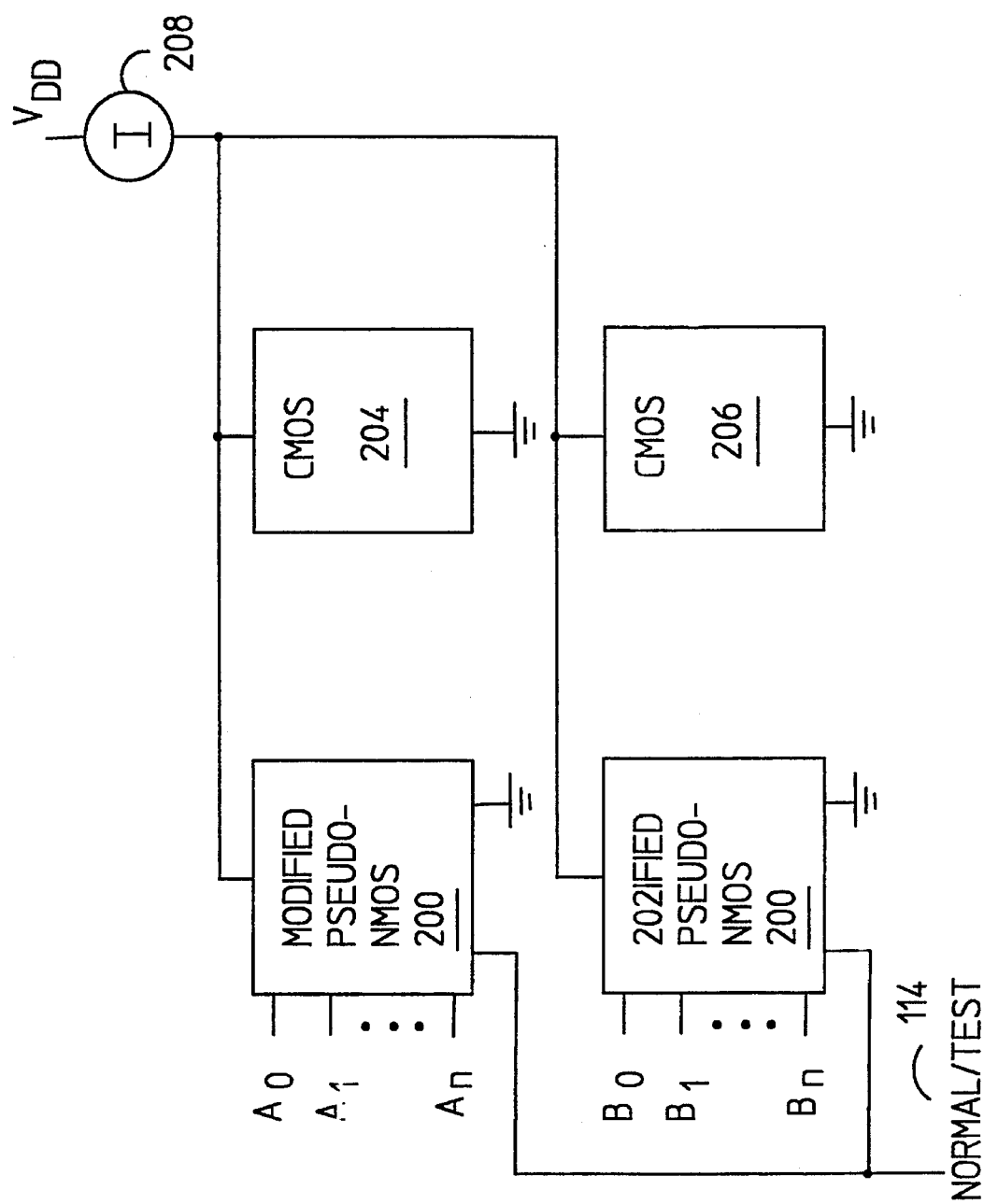
FIG. 2 is a block diagram schematic of a logic system with mixed CMOS and modified pseudo-nMOS gates with provision for IDDQ testing.

FIG. 2 illustrates a logic system containing a mix of standard CMOS logic and modified pseudo-nMOS logic. Gates 200 and 202 depict modified pseudo-nMOS logic gates as illustrated in FIG. 1C. Gates 204 and 206 depict standard CMOS logic gates. As illustrated in FIG. 2, the mode signal 114 (NORMAL/TEST) is connected to all the modified pseudo-nMOS logic gates. As also illustrated in FIG. 2, an ammeter 208 measures power supply current for all gates in the entire system. Without the control gate 112 illustrated in FIG. 1C, current through the pseudo-nMOS logic gates 200 and 202 would prevent an accurate measurement of current flowing as a result of defects. With the control gate 112 illustrated in FIG. 1C, when NORMAL/TEST 114 is logically false, the modified pseudo-nMOS logic gates 200 and 202 draw negligible static current. Therefore, any excessive current as measured by ammeter 208 is a result of circuit defects and not parallel paths through pseudo-nMOS gates. In addition, the logical function of the modified pseudo-nMOS logic gates 200 and 202 is not affected so they can continue to provide output pull-up voltages and can propagate test vectors used for IDDQ testing.

Note that although pseudo-nMOS logic circuits are more common, pseudo-pMOS logic circuits may also be used. In a pseudo-pMOS logical NAND circuit, there is an arbitrary number of p-channel MOSFET parallel input switches between the power supply and the output and a single n-channel MOSFET load transistor between the output and ground. The n-channel load transistor typically has the gate tied to the power supply voltage. Therefore, the load transistor conducts current when the output is high. To suppress current flow through the load transistor during IDDQ testing, a two-input load control gate is used as in FIG. 1C, except the output of the load control gate must be high when the NORMAL/TEST signal is low and the output of the load control gate must be low only when both the NORMAL/TEST signal and the output of the pseudo-pMOS gate are high. This logic requirement is satisfied by making the load control gate a logical NAND gate.

Figure 3:
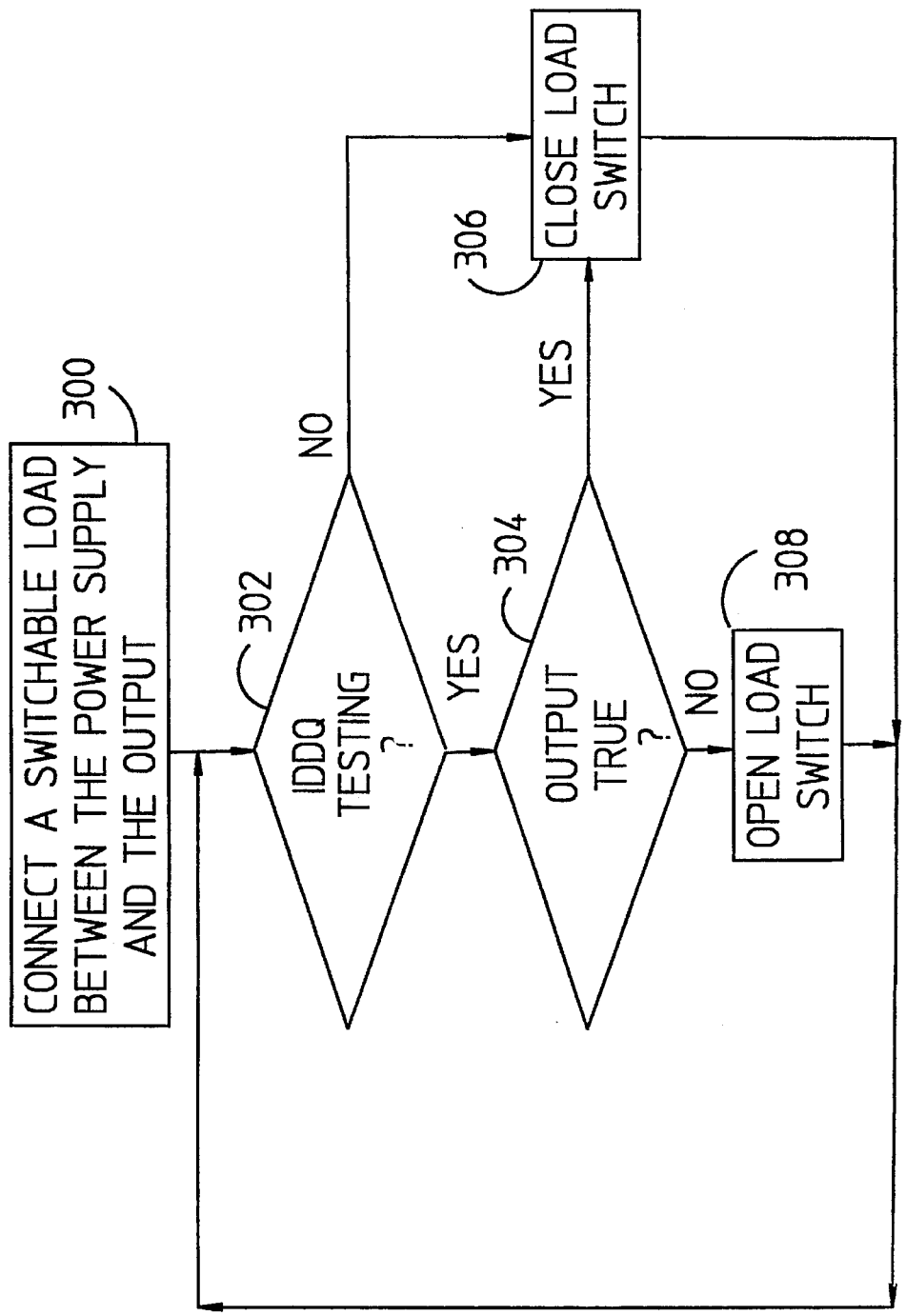
FIG. 3 is a flow chart of a method for minimizing current flow through a logic gate during quiescent current testing.

FIG. 3 is a flow chart illustrating a method to minimize current flow through a logic gate during quiescent current testing. If the system mode is normal (step 302, path NO) then the load switch remains closed (step 306). If the system is in a test mode (step 302, path YES) and the output of the logic gate is true, then the load switch remains closed (step 306). If the system is in a test mode (step 302, path YES) and the output of the logic gate is false, then the load switch is opened (step 308).

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method for minimizing current flow through a logic gate during quiescent current testing, the logic gate having a power supply terminal, and an output capable of being in a true logical state or a false logical state, the method comprising the following steps:

a. connecting a switchable load between the power supply terminal and the output, the switchable load capable of being switched to an open state or to a closed state;

b. switching the switchable load to the closed state if the output is at the true logical state; and c. switching the switchable load to the open state if the output is at the false logical state.

2. A logic circuit comprising:

at least one logic input receiving a logic input signal;

a test input receiving a test signal, the test signal indicating a normal mode or a test mode;

an output, the output being logically true or logically false dependent on the logic input signal and independent of the test signal;

a power supply terminal;

a load switch connected between the power supply terminal and the output, the load switch either open or conducting, the load switch conducting when the test signal indicates the normal mode; and when the test signal indicates the test mode, the load switch is conducting when the output is logically true and the load switch is open when the output is logically false.

* * * * *